US010666268B2

(12) United States Patent
Raghavan

(10) Patent No.: US 10,666,268 B2
(45) Date of Patent: May 26, 2020

(54) REAL TIME CLOCK WITH NEURAL NETWORK CORRECTION OF TEMPERATURE-BASED CHANGES IN FREQUENCY

(71) Applicant: Eta Compute, Inc., Westlake Village, CA (US)

(72) Inventor: Gopal Raghavan, Thousand Oaks, CA (US)

(73) Assignee: Eta Compute, Inc., Westlake Village, CA (US)

(*) Notice: Subject to any disclaimer, the term of this patent is extended or adjusted under 35 U.S.C. 154(b) by 0 days.

(21) Appl. No.: 16/538,569

(22) Filed: Aug. 12, 2019

(65) Prior Publication Data

US 2020/0052704 A1 Feb. 13, 2020

Related U.S. Application Data

(60) Provisional application No. 62/718,303, filed on Aug. 13, 2018.

(51) Int. Cl.
*H03B 5/32* (2006.01)
*G06F 1/14* (2006.01)
(Continued)

(52) U.S. Cl.
CPC ............... *H03L 1/027* (2013.01); *G06F 1/08* (2013.01); *G06F 1/14* (2013.01); *G06N 3/08* (2013.01);
(Continued)

(58) Field of Classification Search
CPC .... G06F 1/08; G06F 1/14; G06N 3/08; H03B 5/30; H03B 5/32; H03B 5/36;
(Continued)

(56) References Cited

U.S. PATENT DOCUMENTS 6,166,608 A * 12/2000 Merriss ..................... H03L 1/00
331/158
2012/0042192 A1* 2/2012 Rae ........................ H03L 1/026
713/500
(Continued)

*Primary Examiner* — Levi Gannon
(74) *Attorney, Agent, or Firm* — SoCal IP Law Group LLP; Angelo Gaz; Steven Sereboff

(57) ABSTRACT

Temperature-independent clock generation systems and methods are described that include a trained neural network coupled to a frequency correction circuit that corrects a crystal resonator output of a clock signal having a frequency that changes with changes in temperature. The neural network is trained with test temperatures and corresponding temperature based changes in frequency for test resonators of the same type as the resonator of the real time clock. The neutral network is trained to output frequency corrections based on a set of measured reference temperature-based changes in frequency for the crystal resonator and a current temperature of the resonator. The frequency correction circuit receives the frequency corrections from the neural network and corrects changes in the frequency caused by the changes in temperature of the resonator to provide a clock signal having an output frequency that is independent of the current temperature of the resonator.

17 Claims, 10 Drawing Sheets

(51) Int. Cl.
*G06N 3/08* (2006.01)
*H03L 1/02* (2006.01)
*H03H 9/19* (2006.01)
*G06F 1/08* (2006.01)

(52) U.S. Cl.
CPC ............... *H03B 5/32* (2013.01); *H03H 9/19* (2013.01); *H03L 1/026* (2013.01); *H03L 1/028* (2013.01)

(58) Field of Classification Search
CPC ........ H03B 5/362; H03B 5/364; H03B 5/366; H03B 5/368; H03H 9/19; H03L 1/02; H03L 1/022; H03L 1/023; H03L 1/025–028
USPC ........................................ 331/154, 158, 176
See application file for complete search history.

(56) References Cited

U.S. PATENT DOCUMENTS

| | | | |
|---|---|---|---|
| 2013/0041859 A1* | 2/2013 | Esterlilne | G06N 3/02 706/25 |
| 2019/0238092 A1* | 8/2019 | Sudo | H03L 1/022 |

* cited by examiner

REAL TIME CLOCK WITH NEURAL NETWORK CORRECTION OF TEMPERATURE-BASED CHANGES IN FREQUENCY

RELATED APPLICATION INFORMATION

This patent claims priority from provisional patent application 62/718,303, filed Aug. 13, 2018, titled "REAL TIME CLOCK WITH NEURAL NETWORK CORRECTION OF TEMPERATURE-BASED CHANGES IN FREQUENCY" which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to the correction of temperature-based changes in frequency of a real time clock.

Description of the Related Art

Real time clock correction of changes in frequency due to changes in temperature has historically been performed using a mathematical algorithm such as a parabolic, quadratic or N-degree equation to model the change in the resonant pulse frequency of a crystal resonator of the clock when the temperature of that crystal changes. The resonator may be a crystal oscillator such as an electronic oscillator circuit that uses the mechanical resonance of a vibrating crystal of piezoelectric material to create an electrical signal with a precise frequency. This frequency is often used to keep track of time, as in quartz wristwatches, to provide a stable clock signal for digital integrated circuits, and to stabilize frequencies for radio transmitters and receivers. A common type of piezoelectric resonator used is the quartz crystal, so oscillator circuits incorporating them became known as crystal oscillators, but other piezoelectric materials including polycrystalline ceramics are used in similar circuits. The resonator may be manufactured for frequencies from a few tens of kilohertz to hundreds of megahertz or greater.

Changes in frequency of a crystal resonator may be caused when the changes in its temperature create variations in the value of the elastic constants, dimension and/or other characteristic of the crystal resonator. Thus, as the temperature of the crystal changes, the output signal of the resonator increases or decreases away from a constant or design specification frequency. This may be referred to as temperature-based changes in vibrating crystal resonator frequency.

Throughout this description, elements appearing in figures are assigned three- or four-digit reference designators, where the two least significant digits are specific to the element and the most significant digit(s) is(are) the figure number where the element is introduced. An element that is not described in conjunction with a figure may be presumed to have the same characteristics and function as a previously-described element having the same reference designator.

DETAILED DESCRIPTION

There is a desire to improve the accuracy of the correction of real time clock frequency due to changes in temperature. Descriptions herein include embodiments of a neural network to correct for changes in frequency due to changes in temperature, such as to accurately predict and correct for changes in the resonant pulse or clock frequency of a vibrating crystal resonator of a clock over a range of temperature changes of that crystal or clock.

Figure 1A:
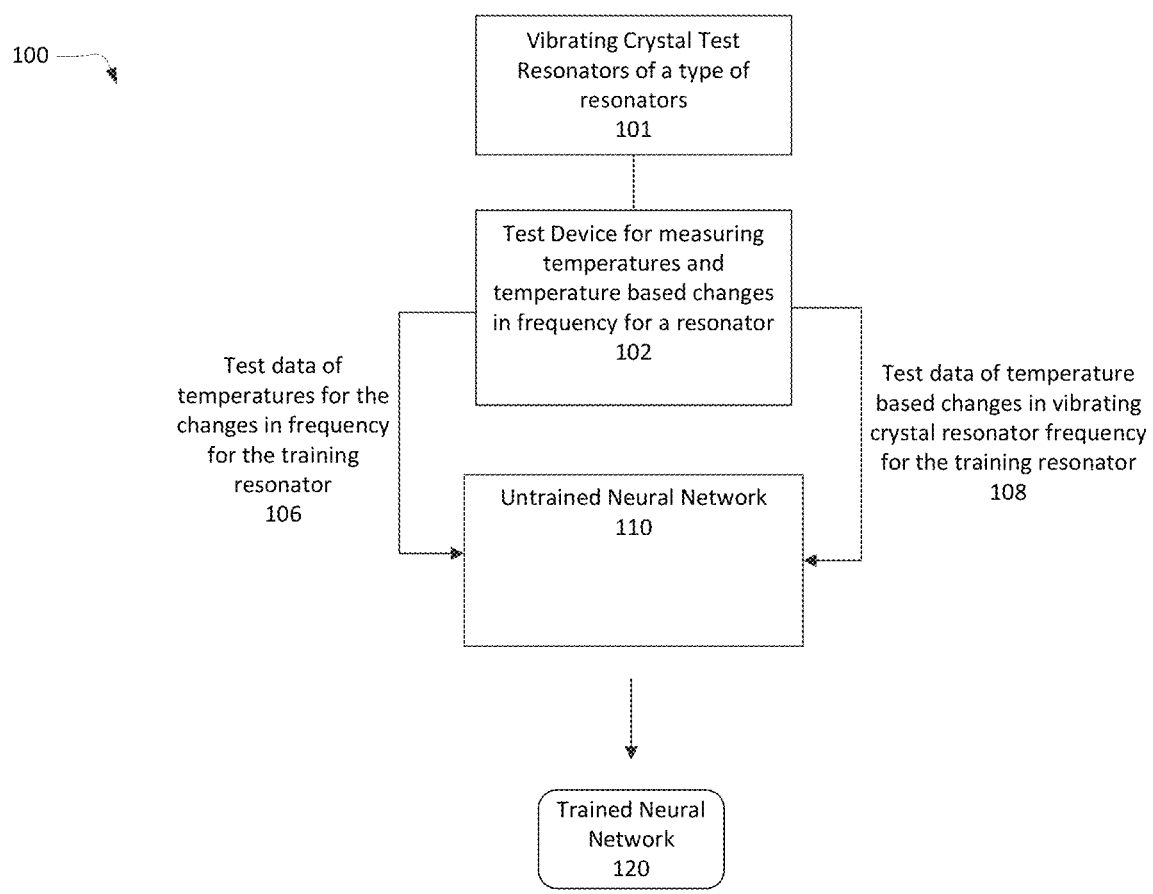
FIG. 1A is a block diagram of a system for training an untrained neural network with temperature-based changes in vibrating crystal resonator frequency for a type of resonator.

FIG. 1A is a block diagram of the system 100 for training an untrained neural network 110 with temperature-based changes in vibrating crystal resonator frequency for a type of resonator. The system 100 may later include or create the trained neural network 120. A "temperature-based" change in a vibrating crystal resonator (e.g., a "resonator") frequency may be a change in the frequency of the clock signal or resonant pulse output by the resonator that is caused by changes in temperature of the resonator or of a real time clock using the resonator.

The system 100 includes vibrating crystal test resonators of a type of resonator 101. The type of resonator may be identified by nominal frequency, brand, make, model, and/or having certain technical specifications. In some cases, the type is identified by having a certain, nominal or selected resonant pulse frequency. The test resonators and resonators to be corrected (e.g., see resonator 155 of FIG. 1D) may be the same or similar type of resonator. They may have the same nominal or design point, resonant pulse frequency (e.g., as identified during testing, by resonator make and model, and/or by technical specification). Testing data is typically collected over 10-100 resonators, or in some cases more than 100 resonators.

The system 100 includes the test device 102 for measuring temperatures 106 and temperature-based changes in frequency 108 for a vibrating crystal resonator, such as for vibrating crystal test resonators of a type of resonator 101. The test device 102 may include components for measuring the temperature of the resonator and the vibrating crystal resonator output frequency of the resonator when it is at that temperature. The test device 102 may calculate or measure the temperature-based changes in frequency by subtracting a nominal (e.g., desired, normal, constant or specification based) resonant pulse frequency of the vibrating crystal resonator from the currently measured vibrating crystal resonator output frequency of the resonator when it is at that measured temperature. The nominal pulse frequency may be a frequency of the resonator during normal or nominal use of the clock or a processor having the clock. The components of the test device 102 may include computer equipment (e.g., computers, processors, memory, software, chips), temperature sensors (e.g., high accuracy thermometers), frequency sensors (e.g., oscilloscopes, spectrum analyzers, and the like).

The test device 102 may provide data, such as identification of one type of different types of resonators that the untrained neural network 110 will be trained for; and the test data 106 and 108 to be used to train the untrained neural network 110. The untrained neural network 110 may be trained to become or create the trained neural network 120. The trained neural network 120 may be used to accurately predict and correct for changes in the resonant pulse frequency of a vibrating crystal resonator of a clock over a range of temperature changes of that crystal or clock. The changes may be changes from the nominal frequency. A resonator used for testing may be called a "test resonator" and those being corrected in the clock may be called "resonators to be corrected."

The test device 102 determines, stores and/or outputs to the untrained neural network 110, the test data of temperatures 106 and corresponding test temperature-based changes in the frequency 108 for a test resonator of a type of resonators 101. The test data of temperatures 106 and corresponding test temperature-based changes in the frequency 108 for a test resonator may include a set of reference temperatures and corresponding temperature based changes in frequency that are measured and stored for a resonator to be corrected. The test device 102 may determine, store and/or output data 106 and 108 to the untrained neural network 110, for each of the test resonator of a type of resonators 101. The test data 106 and 108 for all of the test resonator devices 101 are input to train the untrained neural network 110.

Figure 1B:
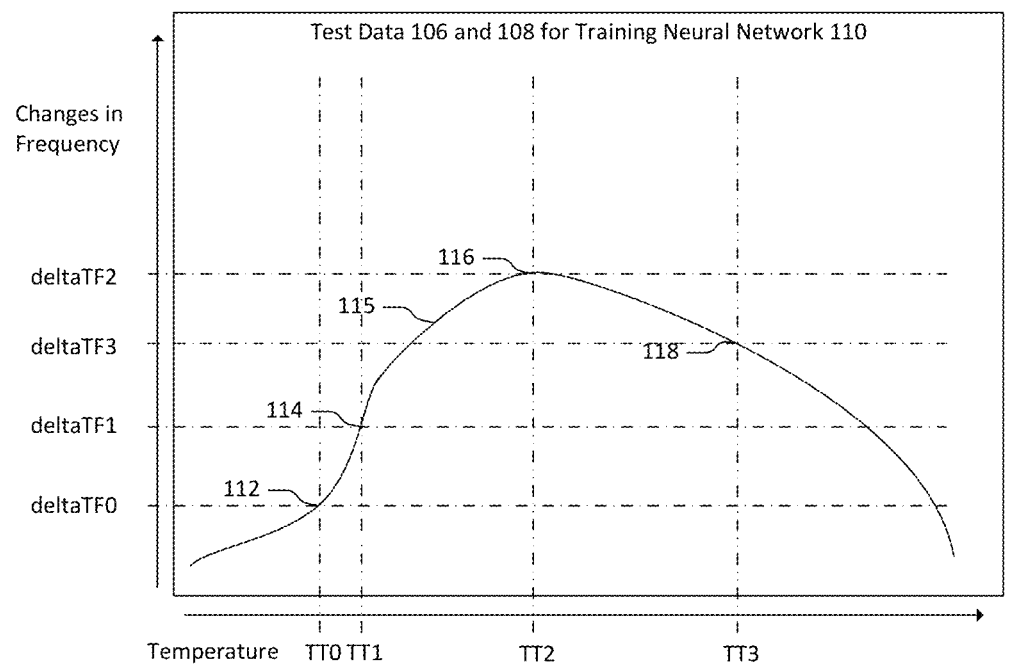
FIG. 1B is a graph showing training data for training an untrained neural network with temperature-based changes in vibrating crystal resonator frequency for a type of resonator.

FIG. 1B is a graph 111 showing training data 106 and 108 for training an untrained neural network 110 with temperature-based changes in vibrating crystal resonator frequency for a type of resonator, such as resonators 101. Graph 111 shows an example for four test temperatures TT0, TT1, TT2 and TT3 having corresponding test changes in frequency deltaTF0, deltaTF1, deltaTF2 and deltaTF3 as noted at data 112, 114, 116 and 118, respectively. In one case, data 112, 114, 116 and 118 are test data 106 and 108 for each entry of training data. For example, deltaTF0-deltaTF3 are test data 108 and test temperatures TT0-TT3 are test data 106.

The data 112-118 forms or is part of curve 115 such as a curve resulting from training network 120 for a single test resonator or resonators 101. For example, for any one resonator of resonators 101, various different ones of data 106 and 108 at various temperatures (e.g., data 112-118) may be input to train network 110. For instance, for a test resonator, network 120 may be trained with input data 112-118 as data 106 and 108 for various different temperatures Tx. This will train the network with a data point for each Tx to further define curve 115 for a single test resonator.

Network 110 may be further trained by inputting various ones of data 106 and 108 for various different temperatures Tx for all of the resonators of resonators 101. This will train the network with additional curves similar to curve 111 for each of the test resonators 101. Each curve will have similar test temperatures TT0-TTn and corresponding changes in frequency deltaTF0-deltaTFn those temperatures.

The test data 106 (e.g., TT0-TT3) may be a number of test temperatures of, or measured, for the test resonator by the device 102 when the test resonator is at a certain test temperature (e.g., is temperature stable). The test data 106 may be two or more test temperatures selected to characterize a non-linear curve or waveform (e.g., curve 115) of temperature-based changes in frequency for the test resonator that is used for training the untrained neural network 110. They may be selected as specific temperatures of the crystal or clock. The specific test temperatures may be between the reference threshold low and threshold high temperatures. They may be selected to most easily characterize the curve. The test temperatures may be in a temperature range of between minus 40 degrees Celsius and plus 125 degrees Celsius. The test device 102 determines, stores and/or outputs to the untrained neural network 110, the test data 108 of test temperature-based changes in vibrating crystal resonator frequency for the test resonator corresponding to the temperatures of the test data 106. The test data 108 may be a number of test temperature-based changes in vibrating crystal resonator frequency measured by the device 102 when the test resonator is at a certain test temperature as indicated by the test data 106.

The test data 108 (e.g., deltaTF0-deltaTF3) may be a number of test changes in test frequency of the resonator pulse output frequency that are caused or result from the test temperatures selected for the test data 106. Each test temperature may have a corresponding test temperature-based change in frequency. Along with the test temperatures, the test changes in frequency may be used to characterize a non-linear curve or waveform of temperature-based changes in frequency (e.g., curve 115) for the test resonator that is used for training the untrained neural network 110. In one example, the training of the network 110 may determine or create weightings between neurons of the neural network that create or are part of the trained network 120 (e.g., see FIG. 4). The output of each neuron is that neuron's nonlinear function of the weighted sum of the inputs to the neuron.

The training of the network 110 includes updating the weightings between neurons at each neuron of the neural network to minimize the difference between an output of the networks predicted change in the frequency (e.g., deltaFC) at a temperature of data 106 and the actual change in frequency in the data 108. Once the difference between deltaFC and data 108 is below a desired or predetermined threshold for a desired number of training temperatures 106, the network 110 becomes the trained network 120.

Once network 120 is trained, it can correct temperature-based changes in frequency for a resonator to be corrected when input with reference temperature based changes in frequency that characterize that resonator in the network and a temperature of the resonator to find the corresponding frequency correction deltaFC for the temperature.

Figure 1C:
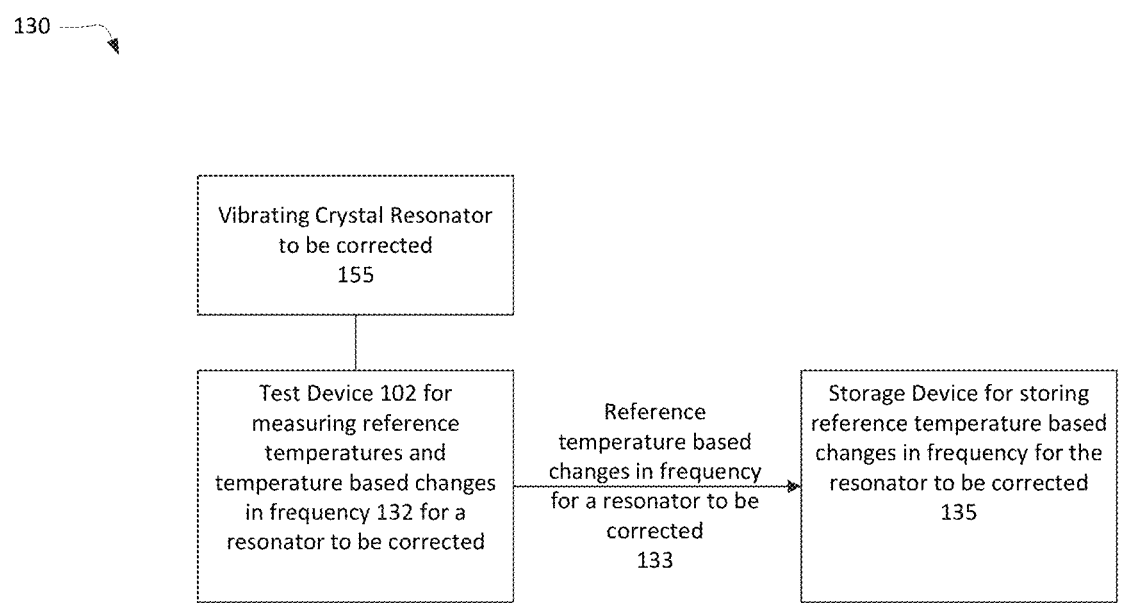
FIG. 1C is a block diagram of a system for storing in a storage device, reference temperature-based changes in frequency for a resonator to be corrected.

FIG. 1C is a block diagram of the system 130 for measuring and storing in a storage device 135, reference temperature-based changes in frequency 133 of a resonator to be corrected 155. The system 130 may use the test device 102 to measure reference temperatures and temperature-based changes in frequency 132 of a resonator to be corrected 155, similar to the descriptions for the system 100 measuring those of a test resonator of resonators 101 for the test data 106 and 108.

Figure 1D:
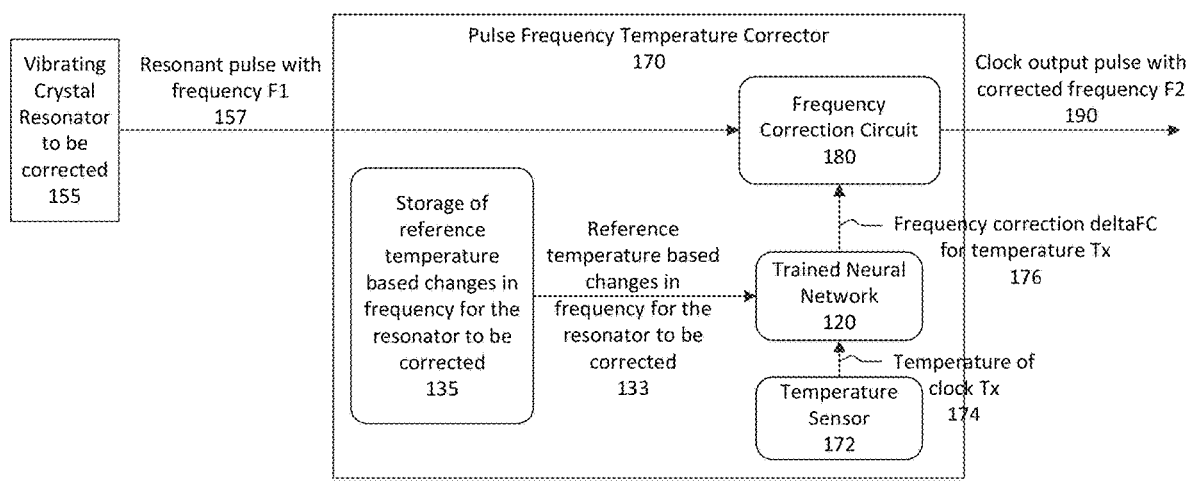
FIG. 1D is a block diagram of a real time clock that uses a trained neural network to correct temperature based changes in the pulse frequency of a vibrating crystal resonator.
Figure 1E:
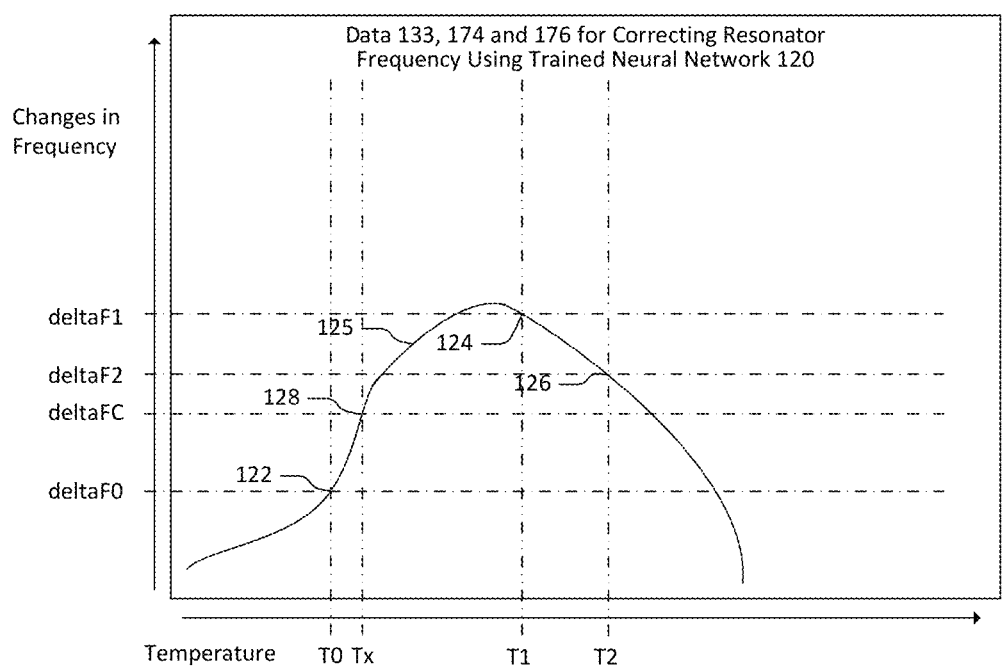
FIG. 1E is a graph showing reference temperature based changes in frequency, temperature of the clock and a frequency correction for a resonator to be corrected.

The measured data 132 may be similar to measured data 106 and 108 except data 132 is for resonator 155 while data 106 and 108 are for resonators 101, and data 132 is only at specified reference temperatures (e.g., T0-T2 of FIG. 1E). For example, measured data 132 may be similar to measured data 106 and 108 but be determined by the test device 102 (or another one of test device 102) for another resonator (e.g., the resonator to be corrected 155) of the type of resonator or resonators 101 used to train the trained model 120.

The reference temperatures (e.g., T0-T2 of FIG. 1E) of data 132 may be two or more reference temperatures selected to characterize a non-linear curve or waveform 125 of reference temperature-based changes in frequency 133 for the resonator to be corrected that are input to the trained neural network 120. They may be selected as specific reference temperatures of the crystal or clock. The specific reference temperatures may be a threshold low, nominal (or normal), and threshold high temperature that can be selected to most easily characterize the curve. They may be two of those three temperatures. In some cases, the specific reference temperatures may be those determined by testing or know to be "nominal" such as a temperature that occurs during normal or nominal use of the clock or a processor having the clock; to be "at a low threshold" such as a temperature that occurs during minimum use of the clock or a processor having the clock; and/or to be "at a high threshold" such as a temperature that occurs during maximum use of the clock or a processor having the clock. They may be between 2 and 5 temperatures. In some cases, they will be 3 temperatures.

The corresponding reference temperature-based changes in frequency (e.g., deltaF0-deltaF2) or 133 may be two or more changes in frequency of the resonator pulse output frequency that are caused or result from the reference temperatures selected (e.g., T0-T2). Each reference temperature may have a corresponding reference temperature-based change in frequency of frequencies 133. The reference changes in frequency 133 may be used to characterize a non-linear curve or waveform 125 of temperature-based changes in frequency for the resonator to be corrected 155 that is used by the trained neural network 120 to determine deltaFC at temperature Tx. In one case, the reference temperatures and the reference changes in frequency are be used to characterize a non-linear curve or waveform 125. In some cases, the changes 133 are stored in the network 120 as inputs 133.

The test device 102 determines or measures data 132 and outputs data 133 to the storage device 135. The system 130 may store or save the temperature-based changes in frequency 133 in a storage device 135, which may be a type of computer memory. The storage device 135 may be a RAM, ROM, flash, hard drive, or other digital memory that can be programmed with and store the data 133 for months or years, such as for use by a real time clock 150. It may be a flash memory that can be reprogrammed as needed to change the reference data. Storage device 135 may be a separated device or chip than a device or chip having the neural network 110 or 120. In other cases, storage device 135 may be incorporated into the same device or chip as the neural network 110 or 120. In one case, reference storage 135 is within or part of the trained neural network 120.

The system 130 may measure data 132 and store data 133 for a resonator to be corrected in a separate one of the storage device 135 for each resonator to be corrected. Storage device 135 and the neural network 120 are part of a pulse frequency temperature corrector device or chip. For instance, the pulse frequency temperature corrector device or chip may include the trained neural network 120 and the storage device 135 prior to storing data 133 on the storage device 135. Then, the data 133 may be stored on the storage device 135 as noted for system 130, to create the pulse frequency temperature corrector 170 shown in FIG. 1D.

FIG. 1D is a block diagram of a real time clock 150 such as a clock that is part of and/or provides a clock signal for a processor. Clock 150 may be a temperature-independent clock generator. The real time clock 150 uses the trained neural network 120 to correct temperature based changes in the pulse frequency 157 of the vibrating crystal resonator 155. The real time clock 150 includes a vibrating crystal resonator to be corrected 155 and a pulse frequency temperature corrector 170. The pulse frequency temperature corrector 170 includes the storage 135 of temperature-based changes in frequency for the resonator to be corrected 133, a temperature sensor 172, the trained neural network 120 and a frequency correction circuit 180.

The pulse frequency temperature corrector 170 may be or include a chip to correct for changes in a resonance pulse frequency of the crystal resonator 155 over changes in temperature of the crystal such as when measured temperature Tx changes.

The vibrating crystal resonator 155 sends or provides a resonant pulse with frequency F1 157 to the frequency correction circuit of the pulse frequency temperature corrector 170. The storage of temperature-based changes in frequency for the resonator to be corrected 135 sends or provides temperature-based changes in frequency for the resonator to be corrected 133 to the trained neural network 120. The temperature sensor 172 sends or provides temperature of clock Tx 174 to the trained neural network 120. The trained neural network 120 sends or provides a frequency correction deltaFC for temperature Tx 176 to the frequency correction circuit 180.

The temperature of clock Tx 174 may be a temperature measure for or at the clock or resonator 155. It may be measured similar to how the test device 102 measures the temperature for the data 106 or 132.

Based on the inputs of temperature-based changes in frequency for the resonator to be corrected 135 and the Temperature of clock Tx 174, the trained neural network 120 outputs frequency the correction deltaFC for temperature Tx 176. The frequency correction deltaFC for temperature Tx 176 may be a temperature-based change in frequency for the resonator to be corrected, based on temperature Tx, similar to test data of temperature-based changes in vibrating crystal resonator frequency for the test resonator 108 being based on the test data temperatures 106. That is, based on being trained with data from the same type of resonators, the network 120 may be able to correct changes in frequency F1 due to changes in temperature Tx, such as to accurately predict and correct for changes in the resonant pulse frequency of a vibrating crystal resonator 155 of real time clock 150 over a range of temperature changes of that crystal resonator or clock.

FIG. 1E is a graph 121 showing reference temperature based changes in frequency, temperature of the clock Tx 174 and frequency correction deltaFC for temperature of the clock 176 for a system 150 for neural network correction of temperature-based changes in frequency for a resonator to be corrected 155. Graph 121 shows an example for three reference temperatures T0, T1 and T2 having corresponding changes in frequency deltaF0, deltaF1 and deltaF2 as noted at data 122, 124, 126, respectively. In one case, data 122, 124 and 126 are reference data 133 for each frequency correction. In another case, only deltaF0, deltaF1 and deltaF2 are reference data 133 and reference temperatures T0, T1 and T2 are already known by the network 120 for each entry of training data. The network may already know the reference temperatures by being programmed to receive the reference data 133 as the changes in frequency for resonator 155 at temperatures T0, T1 and T2.

Graph 121 shows an example for one measured temperature Tx having a corresponding frequency correction deltaFC as noted at data 128. In one case, measured temperature Tx 174 and reference data 133 are input to the network 120 which outputs the corresponding change in frequency deltaFC as data 176 for one entry of temperature Tx measured on a periodic basis. The network 120 may also receive the inputs when temperature Tx exceeds a high and/or low temperature threshold.

The data 122-126 forms or is part of curve 125 such as a curve resulting from inputting deltaF0-deltaF2 into trained network 120 for a resonator to be corrected 155. Network 120 may characterize resonator 155 according to or as curve 125. For example, for one resonator 155, the same reference data 133 and temperature Tx 174 at various temperatures may be input into trained network 120 which will output a correction deltaFC or delta FC for each of the temperatures Tx input with the data 133. For instance, for each Tx (and data 133) the network will find deltaFC along curve 125 of the trained network 155 which is based on input of reference data 133 for that particular resonator 155. That is, the trained network 120 will define a curve 125 for the resonator 155, based on the training data 106 and 108 input during training using inputs 133 and find a deltaFC on that curve 125 for temperature Tx. The temperatures Tx may be in a temperature range of between minus 40 degrees Celsius and plus 125 degrees Celsius.

Based on the input of the frequency correction deltaFC for temperature Tx 176, the correction circuit 180 may correct or change resonant pulse with frequency F1 157 to be clock output pulse with the corrected frequency F2 190. That is, the clock output pulse with corrected frequency F2 190 may be a clock signal with a pulse frequency that is the same as, or within a desired threshold of the nominal pulse frequency of the resonator 155. The threshold may be less than 1 part per million (ppm). In some cases, it may be less than 0.3 ppm.

In one case, the circuit 180 may be or use a programmable capacitor in parallel with the resonator 155 to correct the output frequency. In some cases, circuit 180 may be or use a digital circuit that suppresses, does not output or "swallows" occasional resonant pulses of the resonator to correct the output frequency. In either case the correction is to correct frequency F1 157 to be clock output pulse with corrected frequency F2 190. For example, network 120 may be trained to characterize resonator 155 based on data 133 so that deltaFC can be a reduction in the clock frequency F1 but not an increase. For example, network 120 can be trained to set curve 125 so that the nominal or desired frequency for F1 is at the peak of curve 125 and any changes are only reductions in that frequency.

The components of the corrector 170 may be embodied in computer logic, hardware, circuitry, software and the like. In some case, the storage 135 is computer memory, the sensor 172 is a high accuracy temperature sensor (e.g., thermometer), the network 120 is implemented in software or computer instructions executed by a processor or chip of corrector 170, and/or the circuit 180 is computer hardware or logic controlled or programmed by the network 120. In some cases, network 110 and 120 are implemented in software instruction that are executed by a processor or in electronic hardware, such as software stored in RAM or ROM memory.

Figure 2:
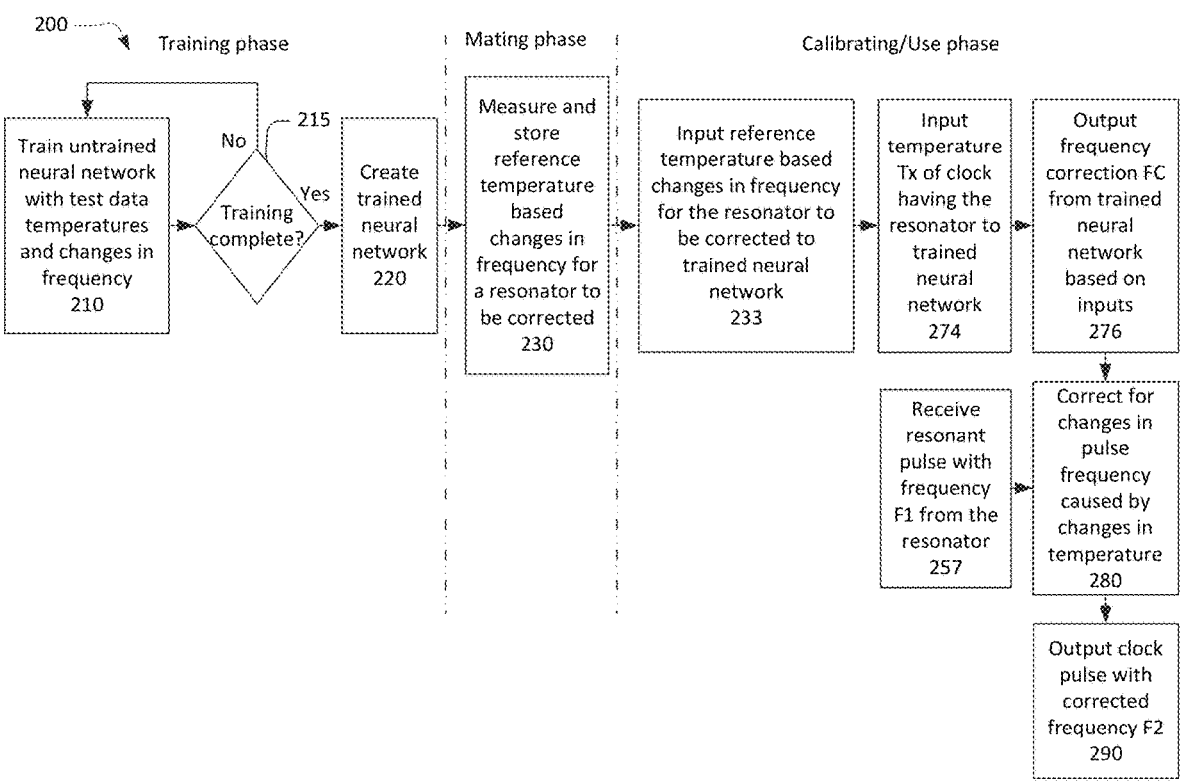
FIG. 2 is a flow diagram of a process for calibrating the pulse frequency of a real time clock over changes in temperature.

FIG. 2 is a flow diagram of a process 200 for calibrating the pulse frequency of a real time clock over changes in temperature, such as the clock 150 having the vibrating crystal resonator 155 that outputs a resonant pulse having a frequency F1 which the corrector 170 uses the network 120 to correct to the frequency F2.

The process 200 starts at 210 with training the untrained neural network 110 with the measured test data temperatures 106 and the corresponding changes in frequency 108 of test resonators 110.

Training at 210 may include measuring various test temperatures 106 and corresponding test temperature based changes in frequency 108 of a number of test resonators of a type of crystal resonator 101 of real time clocks using a test device 102. The test temperatures and corresponding temperature based changes in frequency may include a set of reference temperatures and corresponding temperature based changes in frequency 132. For example, training at 210 may include inputting to an untrained neural network 110, a number of test temperatures 106 and corresponding temperature based changes in frequency 108 for a number of test resonators of a type of crystal resonator 101 of real time clocks (e.g., clock 150). The crystal resonator 155 may output a clock signal having a first frequency F1 that changes in frequency with changes in temperature Tx of the resonator 155 and/or clock 150.

If at 215 the training is not complete, the process 200 returns to 210 such as to further train the network 110 using additional test resonators of resonators 101. Training at 210 may be described as training neural network 120 to correct temperature-based changes in frequency of a vibrating crystal resonator 155.

If at 215 the training is complete, the process 200 continues to 220 such as to create the trained neural network 120. The processes 210, 215 and 220 may be described as a "Training phase" and may be performed by the system 100 and may be repeated to create the network 120 for multiple resonators to be corrected 155 of the same type that network 120 was trained for. The training phase may also be repeated to train multiple networks 120 for multiple types of resonators. Training at 210-220 may include descriptions for FIGS. 1A-1B.

Next, the process 200 continues to 230 to measure and store the temperature-based changes in frequency 133 for a resonator to be corrected 155 in the storage device 135. The process 230 may be described as a "Mating phase" and may be performed by the system 130 and may be repeated to store data 133 into multiple devices 135 for multiple resonators to be corrected of the same type.

The process 230 may include creating the set of reference temperature based changes in frequency 133 for the resonator by measuring reference temperature and temperature based changes in frequency 132 of the resonator at a set of temperatures that correspond to the set of reference temperature based changes desired. This may occur prior to or in order to store changes 133.

The process 230 may include coupling (e.g., attaching or integrating) the trained neural network 120 to a frequency correction circuit 180 that corrects changes in a clock signal F1 that change in frequency with changes in temperature Tx of a crystal resonator 155 that is a same type of crystal resonator as the test resonators 101. It may also include coupling reference inputs of the trained neural network 120 to reference storage 135 that outputs a set of reference temperature based changes in frequency 133 for the resonator; and coupling a temperature input of the trained neural network 120 to a temperature sensor 172 that outputs a current temperature Tx of the resonator. Measuring and storing at 230 may include descriptions for measuring data 132 and storing data 133 at FIG. 1C.

Then, the process 200 continues to 233 to input the temperature-based changes in frequency 133 for the resonator to be corrected to the trained neural network 120. Inputting at 233 may include descriptions for inputting data 133 at FIGS. 1C-1E.

During or after the process 233, the process 200 includes 274 to input the temperature Tx 174 of the clock 150 having the resonator 155 to the trained neural network 120. Inputting at 274 may include descriptions for inputting temperature Tx at FIGS. 1D-1E.

Next, the process 200 continues to 276 to output the frequency correction deltaFC 176 for the temperature Tx from the trained neural network 120 based on the inputs at 233 and 274. Outputting at 276 may include descriptions for outputting correction deltaFC at FIGS. 1D-1E.

Then, the process 200 continues to 257 to receive the resonant pulse with frequency F1 157 from the resonator 155. Receiving at 257 may include descriptions for outputting or receiving frequency F1 at FIGS. 1D-1E.

Next, the process 200 continues to 280 to correct for changes in the pulse frequency F1 received from 257 caused by the changes in temperature Tx using the frequency correction deltaFC 176 from the trained neural network 120. Correcting at 280 may include descriptions for correcting frequency F1 with deltaFC and/or to be frequency F2 at FIGS. 1D-1E.

After, the process 280, the process 200 continues to 290 to output the clock pulse with the corrected frequency F2. Outputting at 290 may include descriptions for outputting frequency F1 corrected based on deltaFC and/or outputting frequency F2 at FIGS. 1D-1E.

The processes 233-290 may be described as a temperature-based "Calibration phase" or a temperature-based real time clock "Use phase". The processes 233-290 may be performed by the clock 150 and may be repeated as desired to update the change in frequency correction deltaFC for the resonator to be corrected based on a temperature of clock Tx 174. For example, process 200 may be repeated periodically or when temperature Tx exceeds a threshold.

Figure 3:
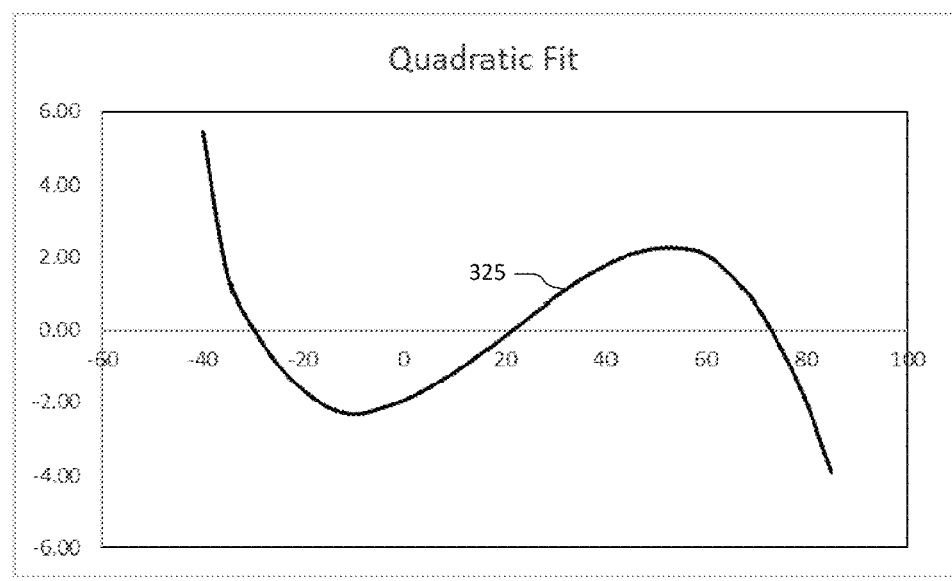
FIG. 3 is a graph of errors resulting from using a quadratic fit or model to predict changes in pulse frequencies over changes in temperature for a vibrating crystal resonator.

FIG. 3 is a graph 300 of errors resulting from using a quadratic fit or model to predict changes in pulse frequencies over changes in temperature for a vibrating crystal resonator. The vertical axis is errors in the prediction in ppm, and the horizontal axis is temperature in degrees Celsius. The curve in the graph 300 may be determined by doing a quadratic fit of changes in pulse frequencies over changes in temperature for one resonator to be corrected. Here, temperature-based changes in frequency 133 can be measured for the resonator to be corrected, such as by test device 102, and fit to a quadratic delta frequency equation of $FCquad = a*T*T + b*T + c$, where FCquad is the frequency correction prediction and T is temperature, to calculate coefficients a, b and c. The delta frequency equation can then be used to predict correction values FCquad in the frequency F1 for different temperature values Tx of that resonator. The predicted FCquad values can be compared with actual values of temperature and temperature-based changes in frequency for the resonator that are measured using a test device 102. The comparison is plotted as the curve 325 in graph 300. The curve may be a comparison for measurements at 3 different temperatures such as reference temperatures. The curve 325 shows errors in the prediction that are greater than −2 ppm for temperatures below 0 degrees, and greater than +2 ppm for temperatures above 0 degrees. In addition, the curve 325 switches from errors below −2 ppm to errors above +3 ppm for temperatures below 0 degrees; and switches from errors above +2 ppm to errors below −3 ppm for temperatures above 0 degrees. Thus, the range of errors shown is at least 4 ppm.

Figure 4:
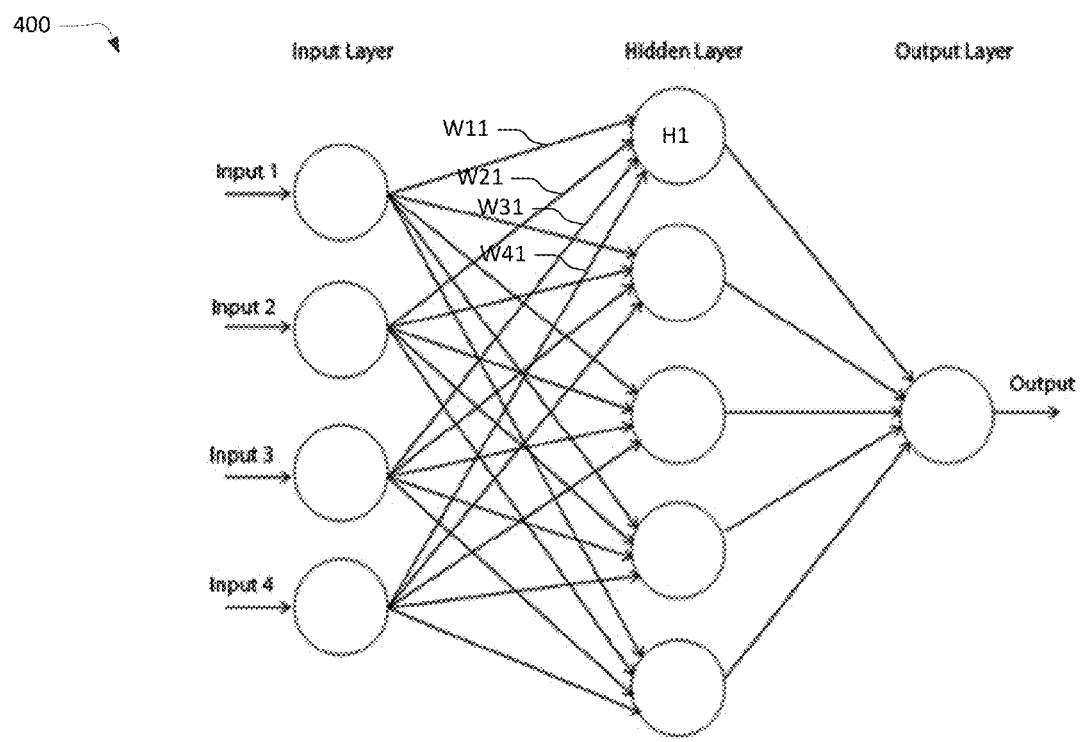
FIG. 4 is a block diagram of a neural network that can be used to correct the pulse frequency of a real time clock over changes in the temperature.

FIG. 4 is a block diagram of a neural network 400 that can be used to correct the pulse frequency F1 of a real time clock over changes in the temperature Tx using deltaFC to be frequency F2. The neural network 400 may be an example of the network 110 and/or the network 120. The network is shown with 4 input layer "neurons", 5 hidden layer neurons and 1 output layer neuron. Various other numbers of input and hidden layer neurons may be used.

During training, training data can be input to all of the input layer neurons and the output layer neuron to be processed by or train all of the neurons. During use, the input layer neurons will receive input data which will be processed by or between all of the neurons and a resulting output will be provided at the output layer neuron.

In one training phase case, the network 400 is the untrained neural network 110 of system 100. In this case, one of the 4 input layer neurons receive test data temperature 106 an inputs (e.g., such as temperatures TT0, TT1, TT2 and TT3 consecutively) and the output is forced to the corresponding temperature-based change in frequency 108 (e.g., such as corresponding deltaTF0, deltaTF1, deltaTF2 and deltaTF3) for one of the test resonators 101. The other inputs 2-4 may be set to other temperatures having the same output, or other values appropriate for training the network 110 given that set of data 106 and 108. For each test resonator of resonators 101, these inputs can be repeatedly input with different pairs of data 106 and 108, to train the network 110. There may be between 4 and 20 pairs for each test resonator. Also, multiple test resonators (e.g., of a type of resonator) can be used to train the network 110.

As noted, the training of the network 110 may determine or create weightings between the input and hidden neurons; and between the hidden and output neuron of the network that create or exist in the trained network 120. For instance, FIG. 4 shows hidden neuron H1 receiving inputs 1-4 with weights W11, W21, W31 and W41, respectively. In a similar manner, the other hidden neurons receive weighted versions of the inputs that may have different or similar weightings. The output of each neuron may be that neuron's nonlinear function applied to the weighted sum of the inputs to the neuron. In some cases, a separate weighting exists between each of the input neurons and all of the hidden neurons; the output of each of the hidden neurons is that neuron's nonlinear function applied to each of the weighted sum inputs from the input neurons; and those outputs of the hidden neurons are summed by the output neuron. In one case, each neuron's nonlinear function is or is based on a sigma or sigmoidal shaped curve such as a curve having a Sigmoid function that maps the input of a signal (e.g., weighted input) to the neuron to the output signal from that neuron. For instance, as a result of each training data input of data 106 and 108, the weighting between each input neuron and all of the hidden neuron can be updated to more accurately model or predict the temperature-based change in frequency due to changes in the temperature, such as to more accurately create an accurate version of curve 115 for each test resonator. In addition, in some cases, as a result of each training data input of data 106 and 108, each neuron's nonlinear function can be updated to more accurately model or predict the temperature-based change in frequency due to changes in the temperature, such as to more accurately create an accurate version of curve 115 for each test resonator.

The training of the network 110 may include updating the weightings between neurons (e.g., W11-W41) to minimize the difference between an output of the networks predicted change in the frequency (e.g., deltaFC) and the actual change in frequency in the data 108 at a temperature of data 106. Once the difference between deltaFC and data 108 is below a desired or predetermined threshold for a desired number of training temperatures 106, the network 110 becomes the trained network 120.

Once network 120 is trained, it can correct temperature-based changes in frequency for a resonator to be corrected by being input with reference temperature based changes in frequency that characterize that resonator in the network and a temperature of the resonator to find the corresponding frequency correction deltaFC for the temperature.

In one use/calibration phase case, the network 400 is the trained neural network 120 of the clock 150. In this case, 3 of the 4 input layer neurons receive reference inputs 133 that are three reference temperature-based changes in frequency 133, such as deltaF0, deltaF1 and deltaF2 for the resonator to be corrected 155; the 4th input layer neuron receives a temperature of clock Tx 174 for a change in frequency correction deltaFC for the resonator to be corrected; and the output neuron outputs the frequency correction deltaFC for temperature Tx 176. The use/calibration phase can be repeated as desired to update the change in frequency correction deltaFC for the resonator to be corrected based on various temperatures of clock Tx 174.

In some cases, the input layer of network 120 may have 3 neurons such as where only two of the three reference temperature-based changes in frequency 133 are input to the network 120 with the other data Tx 174. The training phase of this case is the same as for any other number of changes in reference data 133. In the use phase of this case, 2 of the 3 input layer neurons receive reference inputs 133 that are temperature-based changes in frequency deltaF(T0) and deltaF(T1); the 3rd input layer neuron receives a temperature of clock Tx 174; and the output neuron outputs the frequency correction deltaFC for temperature Tx 176 for the resonator to be corrected. The other input 4 may be set to null or another value appropriate for using the network 120 given that set of data 133 and 174.

Figure 5:
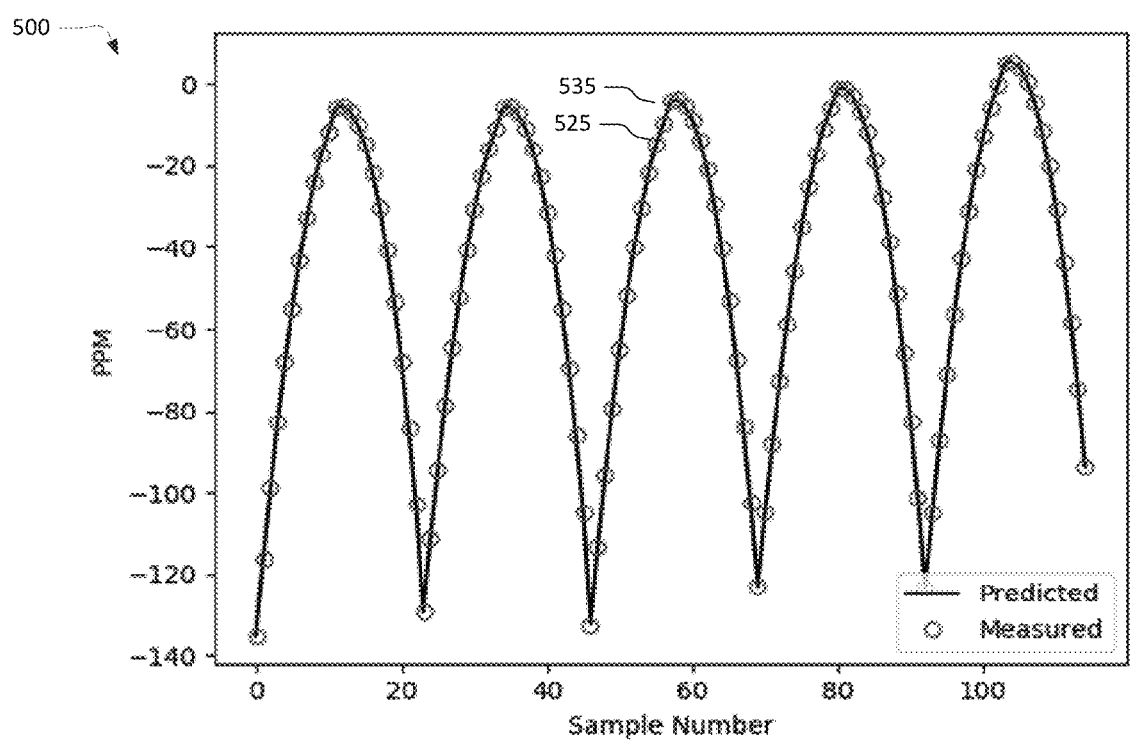
FIG. 5 is a graph of actual changes as compared to changes predicted by a neural network for changes in pulse frequencies caused by changes in temperature for a vibrating crystal resonator.

FIG. 5 is a graph 500 of actual changes as compared to changes predicted by a neural network 120 or 400 for changes in pulse frequencies caused by changes in temperature for multiple vibrating crystal resonators. The vertical axis measures in parts per million (ppm), the predicted values of frequency correction deltaFC 176 output by the network 120 and the actually measured temperature-based change in resonator frequency for various temperatures Tx, such as actual measured test data 108 for the same sample resonator. The horizontal axis is a sample number of 115 samples of data, each comparing the predicted deltaFC to actually measured temperature-based change (e.g., measured as is data 108) in resonator frequency for 5 humps of data that are each over the same temperature range of Tx. Each hump in the plot is for one of 5 different resonators 155 (e.g., each on a separate clock 150 having the same network 120 and corrector 170); and the hump is for various different temperatures Tx over a range (e.g., each hump is similar to curve 125 for a resonator).

In the graph 500, the network predictions deltaFC over changes in temperature Tx are shown by a "Predicted" black line 525 forming vertical humps along the sample numbers. The actual measured temperature-based changes in frequency are shown by "Measured" bubbles 535. In the graph 500, the errors in using the network predictions over changes in temperature are shown by any center of a predicted black line 525 that is not centered in a measured bubble 535. As compared to the graph 300, the graph 500 is more accurate by up to 10× the accuracy. The errors in the graph 500 are less than 1.0 ppm. In fact, they are less than about 0.2 ppm.

Figure 6:
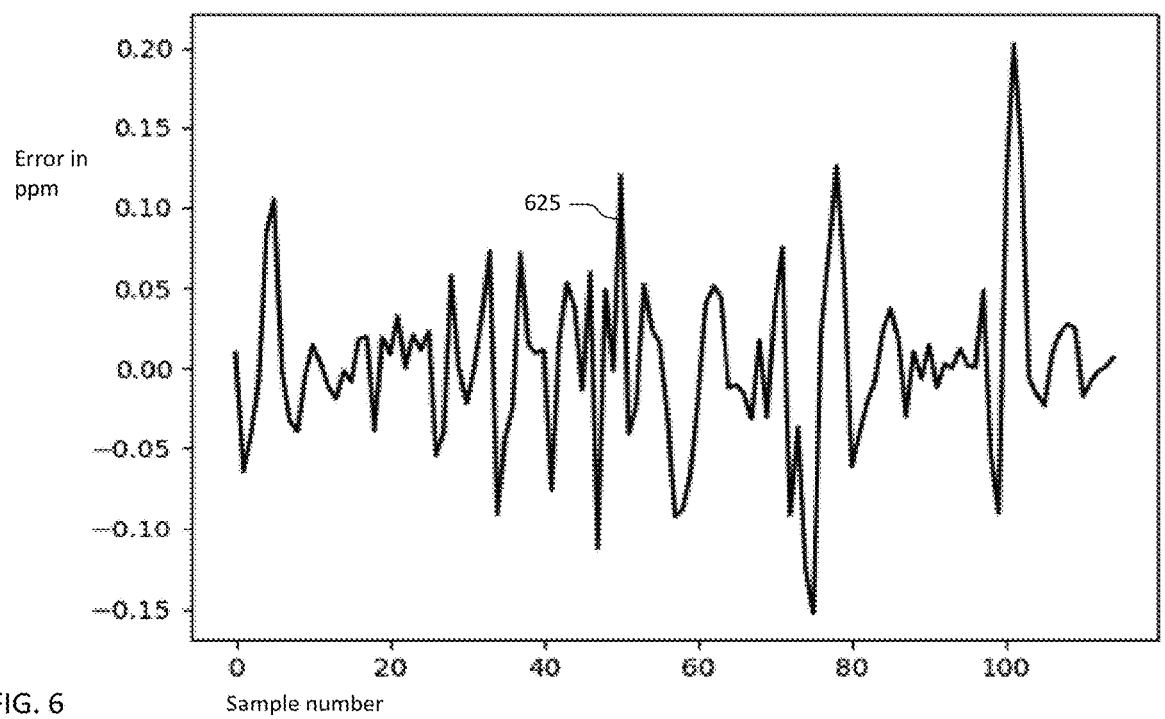
FIG. 6 is a graph of prediction error between actual changes and changes predicted by a neural network for changes in pulse frequencies caused by changes in temperature for a vibrating crystal resonator for FIG. 5.

For example, FIG. 6 is a graph 600 of prediction error between actual changes and changes predicted by a neural network 120 or 400 for changes in pulse frequencies caused by changes in temperature for a vibrating crystal resonator for FIG. 5. The vertical axis measures in ppm the error between the predicted values of the frequency correction deltaFC 176 output by the network and actually measured temperature-based change in resonator frequency for various temperatures (e.g., measured as is data 108) shown in FIG. 5. The horizontal axis is a sample number of the 115 samples in FIG. 5. The vertical distance of the plot 625 in the graph 600 shows is the difference or error distance between the predicted and actually measured temperature-based change in resonator frequency for various temperatures of or in FIG. 5.

Graphing the errors in FIG. 6 is similar to graphing in FIG. 3 but the graph 600 is for many samples and temperatures (115 points) while the plot in the graph 300 is for a single clock or chip over a range of temperatures. As compared to curve 325 of the graph 300 which has at least 4.0 ppm in error ranging from +2.0 ppm to −2.0 ppm, the plot 625 of graph 600 is accurate by greater than 10× the accuracy, having less than 0.4 ppm in error ranging from less than +0.2 ppm to less than −0.15 ppm in error.

The concepts described above with respect to using a neural network to correct for temperature-based changes in the output frequency of a resonator or real time clock can be used to correct for temperature-based changes in other devices and electronic components. For example, a network similar to the network 110 can be trained with data similar to the data 106 and 108; and input with data similar to 133 and Tx but with respect to temperature-based changes in resistance of a resistor, trace, wire or other conductor to create a neural network similar to the network 120 or 400 that can then compensate with a variable resistor for the temperature-based changes in resistance of the resistor, trace, wire or other conductor. A similar weight concept can be applied to using networks similar to the networks 110, 120 and/or 400 trained with data similar to the data 106 and 108; and input with data similar to 133 and Tx but with respect to temperature-based changes in amplification, power consumption, cooling need and controlling processing speed to avoid overheating by having the trained network control a variable resistor at the amplifier output, power limiter or processing speed controller, cooling output regulator, and clock of the processor, respectively.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A temperature-independent clock generator, comprising:
    a crystal resonator to output a first clock signal having a first frequency that changes with changes in temperature of the resonator;
    a reference storage to save a set of measured reference temperature-based changes in frequency for a particular crystal resonator;
    a temperature sensor to output a current temperature of the resonator;
    a trained neural network that receives the set of reference temperature-based changes in frequency for the crystal resonator and the current temperature of the resonator, the trained neural network was previously trained with weightings between a network of neurons that are derived from a plurality of test temperatures and corresponding test temperature based changes in frequency for a plurality of test resonators of that are a same type of resonator as the resonator of the clock generator, the neural network trained to output frequency corrections based on the weightings, the set of reference temperature-based changes in frequency for the crystal resonator and the current temperature of the resonator; and
    a frequency correction circuit that receives the frequency corrections from the neural network and corrects changes in the first frequency caused by the changes in temperature of the resonator to provide a second clock signal having a second frequency that is independent of the current temperature of the resonator.

2. The system of claim 1, wherein the plurality of test temperatures and corresponding temperature based changes in frequency include a set of reference temperatures and corresponding temperature based changes in frequency for the set of reference temperature based changes in frequency output by the reference storage.

3. The system of claim 1, wherein the trained neural network includes the network of neurons coupled between a) reference inputs that receive the set of reference temperature-based changes in frequency for the crystal resonator and a temperature input that receives the current temperature of the resonator and b) an output that outputs the output frequency corrections;
    wherein weightings between the neurons are trained to minimize a difference between the plurality corresponding test temperature based changes in frequency and a plurality of predicted temperature based changes in frequency predicted by the neural network for the plurality of test temperatures for the plurality of test resonators of that are a same type of resonator as the resonator of the clock generator.

4. The system of claim 1, wherein the reference storage is part of the trained neural network.

5. The system of claim 1, wherein the set of reference temperature-based changes in frequency for the crystal resonator are measured changes in frequency of the resonator at a set of temperatures that correspond to the set of reference temperature based changes.

6. A system for neural network based corrections of to Po lure-based changes in frequency of a vibrating crystal resonator of a real time clock, comprising:
    a crystal resonator to output a clock signal having a first frequency that changes with changes in temperature of the resonator;
    a reference storage to store a set of measured reference temperature based changes in frequency for the crystal resonator;
    a temperature sensor to output a current temperature of the resonator to a temperature input of a trained neural network;
    the trained neural network previously trained with weightings between neurons of a network of neurons, the weights derived from a plurality of test temperatures and corresponding test temperature based changes in frequency for a plurality of test resonators of that are a same type of resonator as the crystal resonator of the real time clock, the trained neural network to output frequency corrections to a frequency correction circuit based on the weights, the measured reference temperature based changes in frequency and the temperature input, the frequency corrections to correct changes in the first frequency caused by the changes in temperature of the resonator; and
    the frequency correction circuit to correct changes in the first frequency caused by the changes in temperature of the resonator based on the output frequency corrections of the neural network.

7. The system of claim 6, wherein the trained neural network includes the network of neurons coupled between a) reference inputs that receive the set of reference temperature-based changes in frequency for the crystal resonator and the temperature input and b) an output that outputs the frequency corrections;
    wherein the weightings between the neurons are trained to minimize a difference between the plurality corresponding test temperature based changes in frequency and a plurality of predicted temperature based changes in frequency predicted by the neural network for the plurality of test temperatures for the plurality of test resonators of that are a same type of resonator as the resonator of the real time clock.

8. The system of claim 6, wherein the set of reference temperature-based changes in frequency for the crystal resonator are measured changes in frequency of the resonator at a set of temperatures that correspond to the set of reference temperature based changes.

9. A neural network for correcting temperature-based changes in frequency of a vibrating crystal resonator of a real time clock, comprising:
- previously trained weightings between neurons of a network of neurons, the weights derived from a plurality of test temperatures and corresponding test temperature based changes in frequency for a plurality of test resonators of that are a same type of resonator as the crystal resonator of the real time clock;
- two or more reference inputs for receiving a set of reference temperature based changes in frequency for the resonator;
- a temperature input for receiving a current temperature of the resonator; and
- an output to output frequency corrections to correct changes in a frequency of the vibrating crystal resonator; and
- the neural network trained to generate the frequency corrections based on the weightings, the reference inputs and the temperature input.

10. The neural network of claim 9, wherein the trained neural network includes the network of neurons coupled between a) the reference inputs and the temperature input and b) an output that outputs the frequency corrections;
- wherein the weightings between the neurons are trained to minimize a difference between the plurality corresponding test temperature based changes in frequency and a plurality of predicted temperature based changes in frequency predicted by the neural network for the plurality of test temperatures for the plurality of test resonators of that are a same type of resonator as the resonator of the real time clock.

11. The neural network of claim 9, wherein the trained neural network includes a reference storage to output the set of reference temperature-based changes in frequency for the crystal resonator to the reference inputs; and
- wherein the set of reference temperature-based changes in frequency for the crystal resonator are measured changes in frequency of the resonator at a set of temperatures that correspond to the set of reference temperature based changes.

12. The neural network of claim 9, further comprising:
- the trained neural network to output the output frequency corrections to a frequency correction circuit; and
- wherein the frequency corrections correct changes in a first frequency of a clock signal of the crystal resonator that changes in frequency with changes in temperature of the resonator.

13. A method for training neural network to correct temperature-based changes in frequency of a vibrating crystal resonator, comprising:
- inputting to an untrained neural network, a plurality of test temperatures and corresponding temperature based changes in frequency for a plurality of test resonators of a type of crystal resonator of real time clocks;
- training the neural network to have weightings between neurons of a network of neurons that are derived from the plurality of test temperatures and corresponding test temperature based changes in frequency for the plurality of test resonators; and
- the type of crystal resonator to output a clock signal having a first frequency that changes in frequency with changes in temperature of the resonator.

14. The method of claim 13 further comprising:
- coupling the trained neural network to a frequency correction circuit that corrects changes in a clock signal that change in frequency with changes in temperature of a crystal resonator that is a similar type of crystal resonator as the test resonators;
- coupling reference inputs of the trained neural network to a reference storage that outputs a set of reference temperature based changes in frequency for the resonator; and
- coupling a temperature input of the trained neural network to a temperature sensor that outputs a current temperature of the resonator.

15. The method of claim 14, further comprising:
- creating the set of reference temperature based changes in frequency for the resonator by measuring temperature based changes in frequency of the resonator at a set of temperatures that correspond to the set of reference temperature based changes; and
- storing the set of reference temperature based changes in frequency for the resonator on the reference storage.

16. The method of claim 14, further comprising:
- measuring the plurality of test temperatures and corresponding temperature based changes in frequency of the plurality of test resonators of a type of crystal resonator of real time clocks using a test device.

17. The method of claim 14, wherein the plurality of test temperatures and corresponding temperature based changes in frequency include a set of reference temperatures and corresponding temperature based changes in frequency for the set of reference temperature based changes in frequency output by the reference storage.

* * * * *

UNITED STATES PATENT AND TRADEMARK OFFICE
CERTIFICATE OF CORRECTION

PATENT NO. : 10,666,268 B2
APPLICATION NO. : 16/538569
DATED : May 26, 2020
INVENTOR(S) : Gopal Raghavan Page 1 of 1

It is certified that error appears in the above-identified patent and that said Letters Patent is hereby corrected as shown below:

In the Claims

Column 14, Line 26-27: replace "Po lure-based" with --temperature-based--

Signed and Sealed this
Eighteenth Day of August, 2020

Andrei Iancu
*Director of the United States Patent and Trademark Office*